(12) United States Patent
Kang et al.

(10) Patent No.: US 9,685,498 B2
(45) Date of Patent: Jun. 20, 2017

(54) METHODS OF FORMING DIELECTRIC LAYERS AND METHODS OF MANUFACTURING SEMICONDUCTOR DEVICES USING THE SAME

(71) Applicant: SAMSUNG ELECTRONICS CO., LTD., Suwon-si, Gyeonggi-Do (KR)

(72) Inventors: Sang-Yeol Kang, Seoul (KR); Suk-Jin Chung, Hwaseong-si (KR); Youn-Soo Kim, Yongin-si (KR); Jae-Hyoung Choi, Hwaseong-si (KR); Jae-Soon Lim, Seoul (KR); Min-Young Park, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/201,704

(22) Filed: Jul. 5, 2016

(65) Prior Publication Data

US 2016/0315137 A1     Oct. 27, 2016

Related U.S. Application Data

(62) Division of application No. 13/400,952, filed on Feb. 21, 2012, now Pat. No. 9,412,583.

(30) Foreign Application Priority Data

Mar. 4, 2011    (KR) ........................ 10-2011-0019261

(51) Int. Cl.
    *H01L 49/02*         (2006.01)
    *H01L 21/02*         (2006.01)
    (Continued)

(52) U.S. Cl.
    CPC .......... *H01L 28/60* (2013.01); *H01L 21/0228* (2013.01); *H01L 21/02178* (2013.01);
    (Continued)

(58) Field of Classification Search
    CPC ............... H01L 28/60; H01L 27/10855; H01L 27/10814; H01L 21/02178;
    (Continued)

(56) References Cited

U.S. PATENT DOCUMENTS 6,465,371 B2    10/2002   Lim
7,648,854 B2    1/2010    Lee et al.
(Continued)

FOREIGN PATENT DOCUMENTS

KR    1020020002579 A    1/2002
KR    1020030095125 A    12/2003
(Continued)

*Primary Examiner* — Julio J Maldonado
*Assistant Examiner* — Stanetta Isaac
(74) *Attorney, Agent, or Firm* — Volentine & Whitt, PLLC

(57) ABSTRACT

To form a dielectric layer, an organometallic precursor is adsorbed on a substrate loaded into a process chamber. The organometallic precursor includes a central metal and ligands bound to the central metal. An inactive oxidant is provided onto the substrate. The inactive oxidant is reactive with the organometallic precursor. An active oxidant is also provided onto the substrate. The active oxidant has a higher reactivity than that of the inactive oxidant.

9 Claims, 12 Drawing Sheets

(51) Int. Cl.
  *H01L 21/28*  (2006.01)
  *H01L 29/51*  (2006.01)
  *H01L 27/108* (2006.01)
  *H01L 29/78*  (2006.01)

(52) U.S. Cl.
  CPC .. *H01L 21/02181* (2013.01); *H01L 21/02189* (2013.01); *H01L 21/02271* (2013.01); *H01L 21/28194* (2013.01); *H01L 27/10814* (2013.01); *H01L 27/10855* (2013.01); *H01L 29/517* (2013.01); *H01L 27/10808* (2013.01); *H01L 28/40* (2013.01); *H01L 29/78* (2013.01)

(58) Field of Classification Search
  CPC ......... H01L 21/02181; H01L 21/02271; H01L 21/0228; H01L 21/02189; H01L 21/28194; H01L 29/517; H01L 28/40; H01L 27/10808; H01L 29/78

USPC .................................................. 438/396, 597
  See application file for complete search history.

(56) References Cited

U.S. PATENT DOCUMENTS

| | | |
|---|---|---|
| 8,012,823 B2 | 9/2011 | Lim et al. |
| 2002/0001974 A1 | 1/2002 | Chan |
| 2003/0113480 A1 | 6/2003 | Kil et al. |
| 2008/0070361 A1 | 3/2008 | Yoon et al. |
| 2008/0213940 A1 | 9/2008 | Lee et al. |
| 2009/0011145 A1 | 1/2009 | Yun et al. |
| 2010/0167554 A1 | 7/2010 | Lee et al. |

FOREIGN PATENT DOCUMENTS

| | | |
|---|---|---|
| KR | 20040064974 A | 7/2004 |
| KR | 1020080044644 A | 6/2008 |
| KR | 20100006899 A | 1/2010 |

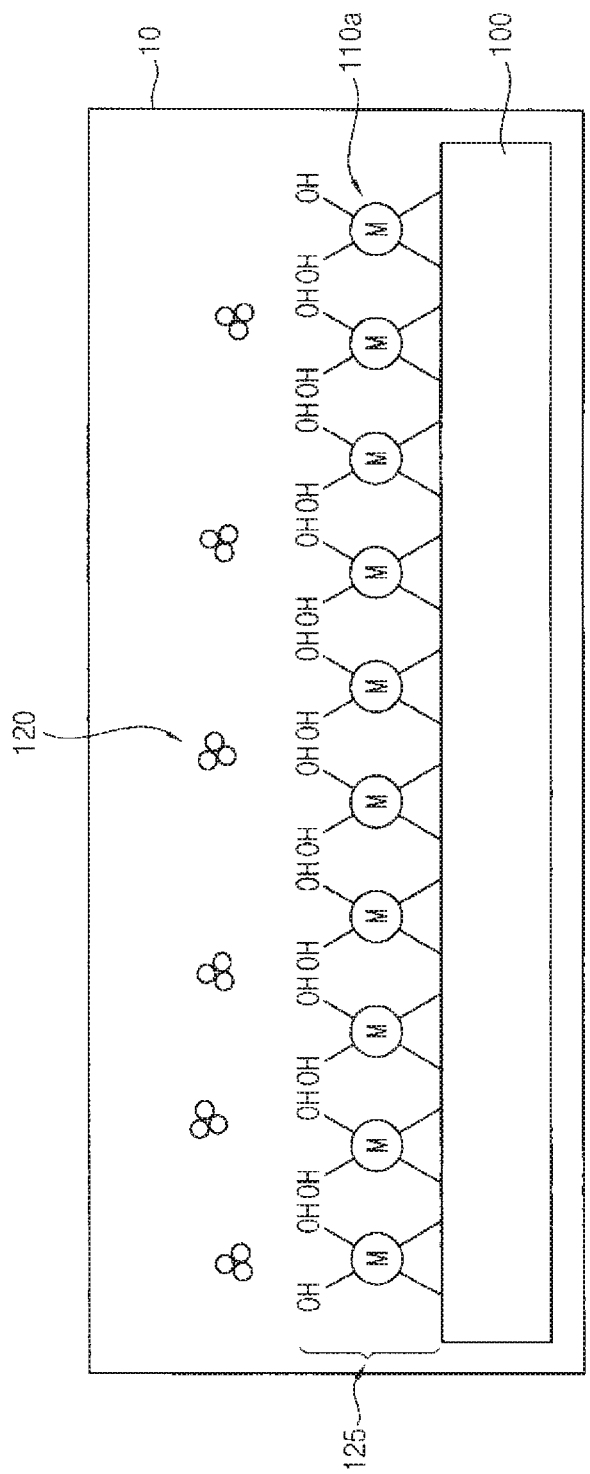

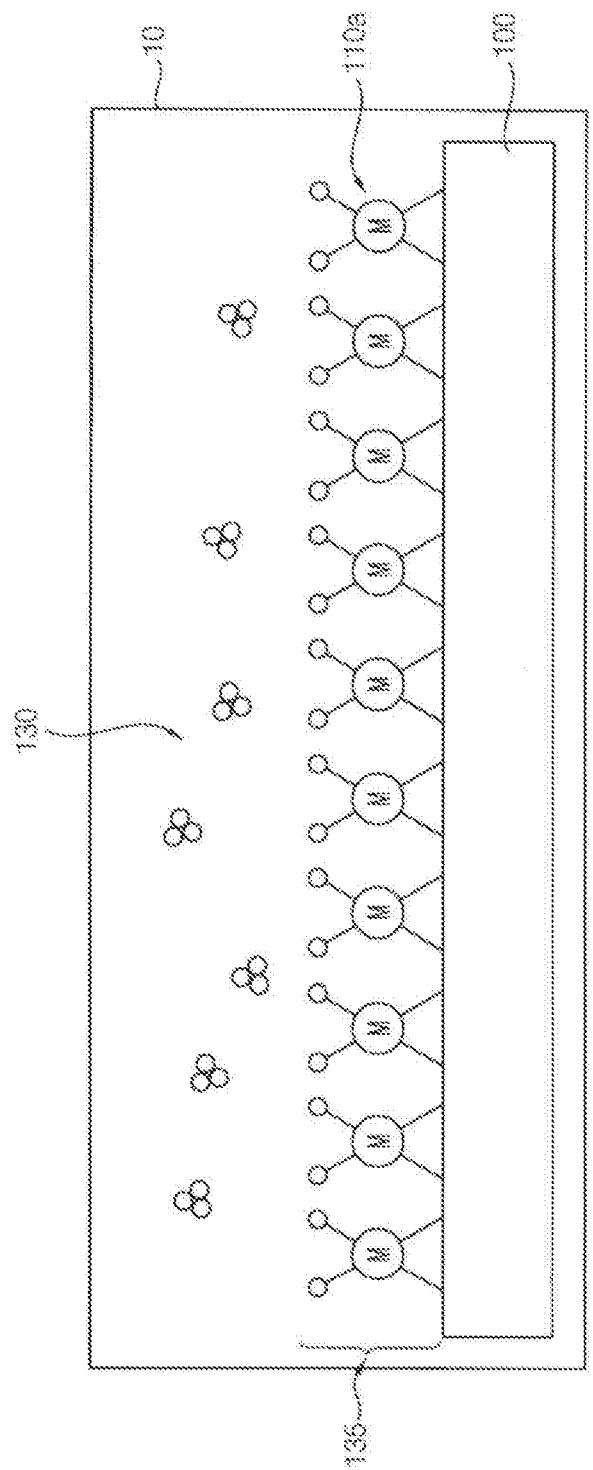

METHODS OF FORMING DIELECTRIC LAYERS AND METHODS OF MANUFACTURING SEMICONDUCTOR DEVICES USING THE SAME

CROSS-REFERENCE TO RELATED APPLICATIONS

This is a Divisional of U.S. application Ser. No. 13/400,952, filed Feb. 21, 2012, in which a claim of priority under 35 USC §119 is made to Korean Patent Application No. 10-2011-0019261 filed on Mar. 4, 2011, in the Korean Intellectual Property Office (KIPO), the entire contents of which are incorporated herein by reference.

BACKGROUND

Example embodiments relate to methods of forming a dielectric layer and to methods of manufacturing a semiconductor device using the same.

Semiconductor devices utilizing memory cell capacitive elements preferably exhibit both high response speeds and large cell capacitances. Thus, research in the fabrication of such devices have largely focused on efforts to achieve increased device integration, reliability and response speeds, while at the same time realizing sufficient capacitance in a limited cell area.

For example, a dielectric layer of a capacitor may be formed using a material having a high dielectric constant, i.e., a high-k material. In order to both sufficient device integration and favorable electrical characteristics, the dielectric layer exhibit both favorable step-coverage and high capacitance properties.

SUMMARY

Example embodiments provide methods of forming a dielectric layer having improved properties or characteristics.

Example embodiments provide methods of manufacturing semiconductor devices using the methods of forming a dielectric layer.

Example embodiments provide method of forming a multi-layer dielectric layer having improved properties and characteristics.

According to example embodiments, there is provided a method of forming a dielectric layer. In the method, an organometallic precursor is adsorbed on a substrate loaded into a process chamber. The organometallic precursor includes a central metal and ligands bound to the central metal. An inactive oxidant is provided onto the substrate. The inactive oxidant is reacted with the organometallic precursor. An active oxidant is provided onto the substrate. The active oxidant has a higher reactivity than that of the inactive oxidant.

According to example embodiments, there is provided a method of manufacturing a semiconductor device. The includes forming a lower electrode on a substrate, and adsorbing an organometallic precursor on the lower electrode. The organometallic precursor includes a central metal and ligands bound to the central metal. The method further includes providing an inactive oxidant onto the lower electrode, where the inactive oxidant is reactive with the organometallic precursor. The method further includes providing an active oxidant onto the lower electrode to form a dielectric layer, where the active oxidant has a higher reactivity than a reactivity of the inactive oxidant. The method further include forming an upper electrode on the dielectric layer.

According to example embodiments, there is provided a method of forming a multi-layer dielectric layer. The method includes loading a substrate into a process chamber, and performing first and second process. The first process which includes introducing a first organometallic precursor into the process chamber, introducing a first inactive oxidant into the process chamber, and introducing a first active oxidant onto the substrate, where the first organometallic precursor includes a first central metal and first ligands bound to the first central metal, and where the first active oxidant has a higher reactivity with the first organometallic precursor than a reactivity of the first inactive oxidant with the first organometallic precursor. The second process includes introducing a second organometallic precursor into the process chamber, introducing a second inactive oxidant into the process chamber, and introducing a second active oxidant onto the substrate, where the second organometallic precursor includes a second central metal and second ligands bound to the second central metal, and where the second active oxidant has a higher reactivity with the second organometallic precursor than a reactivity of the second inactive oxidant with the second organometallic precursor.

BRIEF DESCRIPTION OF THE DRAWINGS

Example embodiments will be more clearly understood from the following detailed description taken in conjunction with the accompanying drawings. The drawings are referenced with respect to non-limiting, example embodiments as described herein.

FIGS. 2A, 2B, 3 and 4 are cross-sectional schematic views for describing methods of forming a dielectric layer in accordance with example embodiments;

Figure 1:
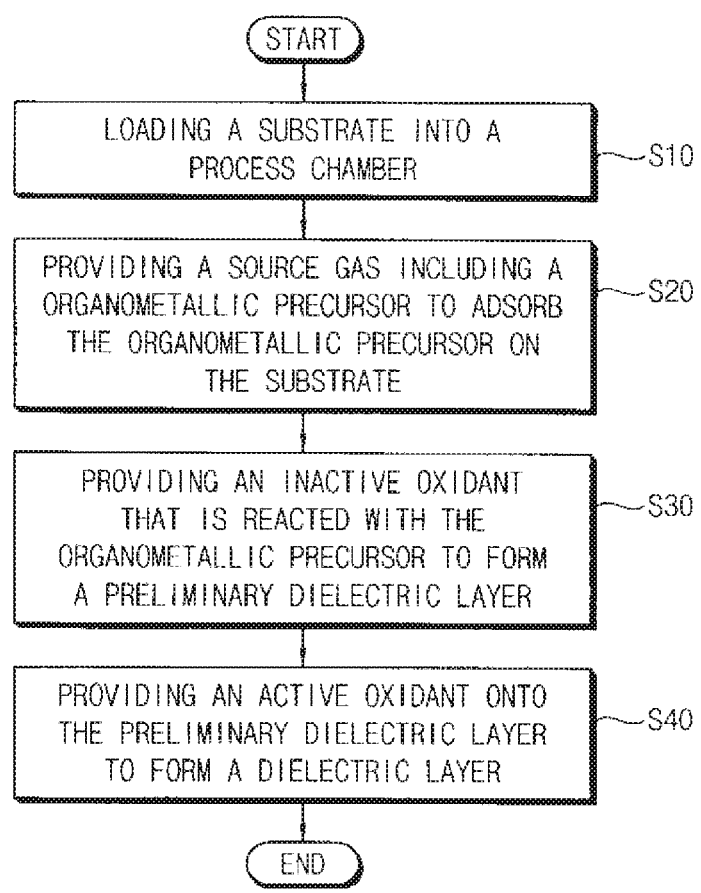
FIG. 1 is a flow chart illustrating a method of forming a dielectric layer in accordance with example embodiments.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF THE EMBODIMENTS

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an and the are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIG. 1 is a flow chart illustrating a method of forming a dielectric layer in accordance with example embodiments. FIGS. 2A through 4 are schematic cross-sectional views for describing methods of forming a dielectric layer in accordance with example embodiments.

Figure 2A:
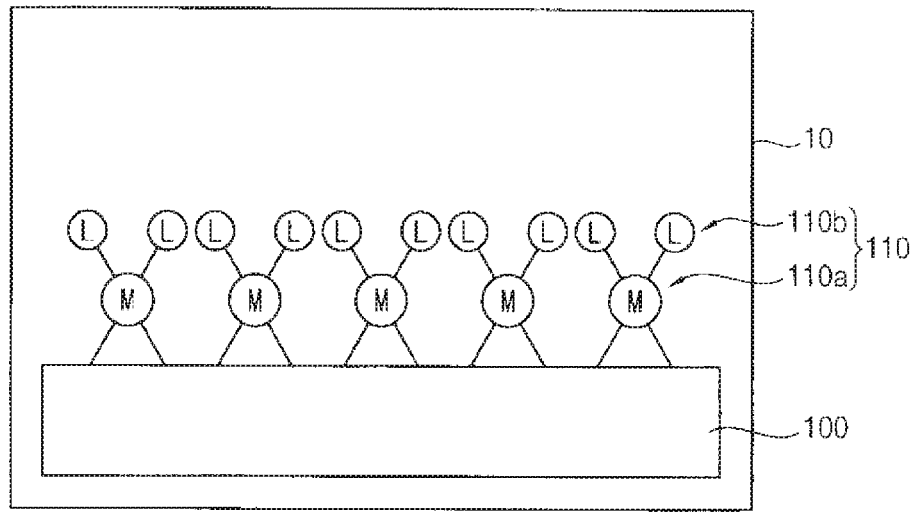
Figure 2B:
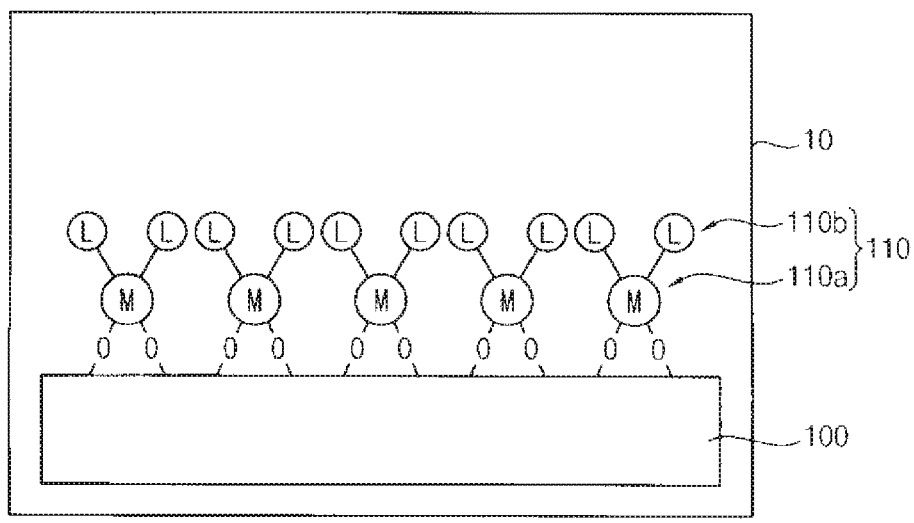

Referring to FIGS. 1 and 2A, in step S10, a substrate 100 may be loaded into a process chamber 10. In an example embodiment, a plurality of substrates 100 may be loaded into the process chamber 10 for improving a process efficiency. The process chamber 10 may have a vertical structure extending in a longitudinal direction, and the substrates 100 loaded into the process chamber 10 may be supported by a boat (e.g., a wafer boat, not illustrated). The substrate 100 may include a semiconductor substrate, e.g., a silicon substrate, a germanium substrate or a silicon-germanium substrate, a silicon-on-insulator (SOI) substrate, a germanium-on-insulator (GOI) substrate, and so on.

Various types of structures (not illustrated) may be formed on the substrate 100. For example, a conductive layer (not illustrated) including a metal, a metal nitride, a metal silicide, a metal oxide, etc., an electrode (not illustrated) or an insulation layer (not illustrated), and so on, may be formed thereon. In some example embodiments, the substrate 100 may include a titanium nitride layer thereon.

In step S20, a source gas including an organometallic precursor may be provided onto the substrate 100 loaded in the process chamber 10. In some example embodiments, the source gas may be vaporized by a bubbler to be provided into the process chamber 10 in a gaseous state.

As illustrated in FIG. 2A, the organometallic precursor 110 may include a central metal 110a represented herein by a symbol "M" and a ligand 110b represented herein by a symbol "L." The ligand 110b may be bound to the central metal 110a.

In example embodiments, the organometallic precursor 110 may be represented by a following chemical formula:

$$M(NL1L2)_n L3_m \qquad \text{chemical formula}$$

In the above chemical formula, M represents a central metal and N represents a nitrogen atom. L1 and L2 may independently represent a C1 to C5 alkyl group bound to the nitrogen atom. Here, "independently" means L1 and L2 may be the same as or different from each other. NL1L2 may represent a ligand bound to the central metal (M) and may be an amido ligand. L3 may represent a ligand which is the same as or different from NL1L2. When L3 is a different ligand from NL1L2, L3 may include a C1 to C5 alkyl group, an aromatic compound having 4 or more carbon atoms or a heterocyclic compound having 4 or more carbon atoms. The aromatic compound or heterocyclic compound may include a substituent or may not include a substituent. The substituent may include a methyl group, an ethyl group or tert-butyl group. Also, in the chemical formula, n and m are integers and $2 \leq (n+m) \leq 8$.

In example embodiments, the central metal 110a may include, as examples, lithium (Li), beryllium (Be), boron (B), sodium (Na), magnesium (Mg), aluminum (Al), potassium (K), calcium (Ca), scandium (Sc), titanium (Ti), vanadium (V), chromium (Cr), manganese (Mn), iron (Fe), cobalt (Co), nickel (Ni), copper (Cu), zinc (Zn), gallium (Ga), germanium (Ge), rubidium (Rb), strontium (Sr), yttrium (Y), zirconium (Zr), niobium (Nb), molybdenum (Mo), technetium (Tc), ruthenium (Ru), rhodium (Rh), palladium (Pd), silver (Ag), cadmium (Cd), indium (In), tin (Sn), antimony (Sb), tellurium (Te), cesium (Cs), barium (Ba), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), hafnium (HD), tantalum (Ta), tungsten (W), rhenium (Re), osmium (Os), iridium (Ir), platinum (Pt), gold (Ag), mercury (Hg), lead (Pb), bismuth (Bi), polonium (Po), raverium (Rr), radium (Ra), actinium (Ac), and/or silicon (Si).

In example embodiments, the organometallic precursor 110 including the central metal 110a and the ligand 110b may include, as examples, tetrakis(ethylmethylamido)zirconium ($Zr(NCH_3C_2H_5)_4$, TEMAZ), tetrakis(ethylmethylamido)hafnium ($Hf(NCH_3C_2H_5)_4$), tetrakis(diethylamido)zirconium ($Zr(N(C_2H_5)_2)_4$, TDEAZ), tetrakis(diethylamido) hafnium ($Hf(N(C_2H_5)_2)_4$), tetrakis(dimethylamido) zirconium ($Zr(N(CH_3)_2)_4$, TDMAZ), tetrakis (dimethylamido)hafnium ($Hf(N(CH_3)_2)_4$), tetrakis (ethyldimethylamido)zirconium ($Zr(N(CH_3)_2C_2H_5)_4$), tetrakis(ethyldimethylamido)hafnium ($Hf(N(CH_3)_2C_2H_5)_4$), tetrakis(diethylmethylamido)zirconium ($Zr(N(C_2H_5)_2 CH_3)_4$), tetrakis(diethylmethylamido)hafnium ($Hf(N(C_2H_5)_2CH_3)_4$), tetrakis(triethylamido)zirconium ($Zr(N(C_2H_5)_3)_4$), tetrakis(triethylamido)hafnium ($Hf(N(C_2 H_5)_3)_4$). These may be used alone or in a mixture of two or more thereof.

The above organometallic precursor 110 may include a single kind of the ligand, i.e., the homoleptic ligand.

In some example embodiments, the organometallic precursor 110 may include heteroleptic ligands. As examples, the organometallic precursor 110 may include bis-diisopropyl amido-bis-dimethylamido-hafnium, bis-diisopropylamido-bis-dimethylamido-zirconium, bis-di-t-butylamido-bis-dimethylamido-hafnium, bis-di-t-butylamido-bis-dimethylamido-zirconium, bis-ethylmethylamido-bis-diisopropylamido-hafnium, bis-ethylmethylamido-bis-diisopropylamido-zirconium, bis-diethylamido-bis-diisopropylamido-hafnium, bis-diethylamido-bis-diisopropylamido-zirconium, tris-diisopropylamido-dimethylamido-hafnium, tris-diisopropylamido-dimethylamido-zirconium, tris-diethylamido-diisopropylamido-hafnium, and tris-diethylamido-diisopropylamido-zirconium. These may be used alone or in a mixture of two or more thereof.

When the source gas is provided onto the substrate 100, the central metal (M) 110a may be adsorbed on the substrate 100 and two ligands (L) 110b may remain to be bound to the central metal 110a as illustrated in FIG. 2A. However, the number of the ligands 110b bound to the central metal 110a is not limited.

Additionally, the central metal 110a may be adsorbed on the substrate 100 in a substantially different manner from that illustrated in FIG. 2A. For example, referring to FIG. 2B, the central metal 110a may be adsorbed on the substrate 100 mediated by oxygen atoms. That is, when the process chamber 10 is in an atmosphere of oxygen ($O_2$) or ozone ($O_3$), the oxygen atoms bound to a top surface of the substrate 100 may serve as adsorbing sites.

In an example embodiment, the source gas may be provided into the process chamber 10 by a carrier gas (not illustrated). The carrier gas may include an inactive gas such as argon (Ar), helium (He), krypton (Kr), xenon (Xe), and so one. These may be used alone or in a combination of two or more thereof.

A portion of the organometallic precursor 110 included in the source gas may be physisorbed on a portion of the organometallic precursor 110 chemisorbed on the top surface of the substrate 100 or may drift in the process chamber 10. In some example embodiments, a first purge gas (not illustrated) may be provided into the process chamber 10 and the process chamber 10 may be pumped out, so that the portion of the organometallic precursor 110 that are not chemisorbed on the top surface of the substrate 100 or drifting in the process chamber 10 may be removed from the process chamber 10. In this case, the portion of the organometallic precursor 110 physisorbed on the portion of the organometallic precursor 110 chemisorbed on the top surface of the substrate 100 may be also partially removed.

When an internal temperature of the process chamber 10 is below about 200° C., a reactivity between the source gas 110 and oxidants 120 and 130 (see FIG. 3 and FIG. 4) subsequently provided may be decreased. When the internal temperature of the process chamber 10 is above about 400° C., a dielectric layer 135 (see FIG. 4) may be crystallized. Thus, the internal temperature of the process chamber 10 may be in a range of about 200 to about 400° C. In example embodiments, the internal temperature of the process chamber 10 may be about 300° C.

Referring to FIGS. 1 and 3, in step of S30, an inactive oxidant 120 that is reacted with the organometallic precursor 110 adsorbed on the substrate 100 may be provided into the process chamber 10 to form a preliminary dielectric layer 125.

The inactive oxidant 120 may have a lower reactivity than that of an active oxidant 130 (discussed later with reference to FIG. 4). Non-limiting examples of the inactive oxidant 120 may include water ($H_2O$), oxygen ($O_2$), nitrous oxide ($N_2O$), alcohol, and a metal alkoxide. These may be used alone or in a mixture of two or more thereof.

The inactive oxidant 120 may have a relatively low reactivity, and thus the inactive oxidant 120 may not directly attack the central metal 110a, and may not break or damage the adsorption between the central metal 110a and the top surface of the substrate 100. The inactive oxidant 120 may be reacted with the organometallic precursor 110 by substituting the ligand 110b bound to the central metal 110a. Accordingly, the ligand 110b may be substituted with a hydroxyl (—OH) group. As illustrated in FIG. 3, the entire ligands 110b may be substituted with the hydroxyl groups. Alternatively, a portion of the ligands 110b may not be substituted by the inactive oxidant 120, to thereby remain undetached from the central metal 110b, because the inactive oxidant 120 may have a very low reactivity.

In some example embodiments, a second purge gas (not illustrated) may be provided into the process chamber 10 and the process chamber 10 may be pumped out, so that the inactive oxidant 120 remaining in the process chamber 10 may be removed. In an example embodiment, the second purge gas may be substantially the same as the first purge gas. In example embodiments, providing the second purge gas and pumping out the process chamber 10 may be repeatedly performed to sufficiently remove the inactive oxidant 120.

Referring to FIGS. 1 and 4, in step of S40, an active oxidant 130 may be provided onto the preliminary dielectric layer 125 to form a dielectric layer 135 on the substrate 100.

The active oxidant 130 may have a higher reactivity than that of the inactive oxidant 120. For example, the active oxidant 130 may include ozone ($O_3$), $O_2$ plasma, remote plasma $O_2$, $N_2O$ plasma or $H_2O$ plasma.

As illustrated in FIG. 4, when the active oxidant 130 is provided onto the preliminary dielectric layer 125, the central metal 110a may be oxidized uniformly so that the dielectric layer 135 having a uniform profile or thickness may be formed. Specifically, when the portion of the ligands 110b are unsubstituted by the inactive oxidant 120, to thereby remain bound to the central metal 110a, the remaining or unsubstituted ligands 110b may be removed by the active oxidant 130. Therefore, the entire central metals 110a may be uniformly oxidized.

In some example embodiments, a third purge gas (not illustrated) may be provided into the process chamber 10 and the process chamber 10 may be pumped out, so that the active oxidant 130 remaining in the process chamber 10 may be removed. In an example embodiment, the third purge gas may be substantially the same as the first and second purge gases. In example embodiments, providing the third purge gas and pumping out the process chamber 10 may be repeatedly performed to sufficiently remove the active oxidant 130.

In example embodiments, a plasma treatment or a heat treatment may be further performed on the dielectric layer 135 to enhance electrical characteristics thereof. The dielectric layer 135 may be densified by the plasma treatment or the heat treatment so that leakage current thereof may be decreased.

In some example embodiments, the processes illustrated with reference to FIGS. 1 to 4 may be performed repeatedly to form the dielectric layer 135 having a multi-layered structure. For example, the dielectric layer 135 having the multi-layered structure may be formed using different kinds of the organometallic precursor 110 to include, e.g., hafnium oxide layer/aluminum oxide layer, zirconium oxide layer/ aluminum oxide layer, hafnium oxide layer/aluminum oxide layer/hafnium oxide layer, zirconium oxide layer/aluminum oxide layer/zirconium oxide layer, and so on.

The inactive oxidant 120 may be provided into the process chamber 10 before providing the active oxidant 130 as illustrated FIGS. 1 to 4. Alternatively, the inactive oxidant 120 and the active oxidant 130 may be simultaneously provided into the process chamber 10.

Figure 5:
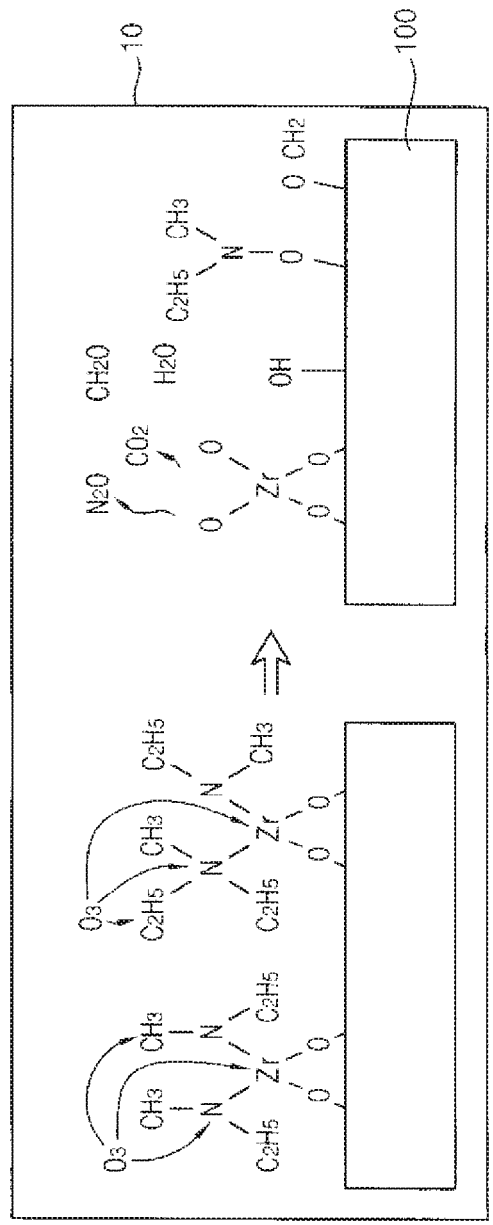
FIG. 5 is a cross-sectional view illustrating a reaction mechanism of an active oxidant and an organometallic precursor when only the active oxidant is provided in a process chamber.

FIG. 5 is a cross-sectional view illustrating a reaction mechanism of the active oxidant 130 and the organometallic precursor 110 when only the active oxidant 130 is provided in the process chamber 10.

FIG. 5 illustrates a case in which TEMAZ is used as the organometallic precursor 110 and ozone is used as the active oxidant 130.

Referring to FIG. 5, ozone is a radical oxidant and may have a very high reactivity, to thereby indiscriminately attack the central metal 110a (i.e., zirconium) and nitrogen or carbon atoms of the ligands 110b (i.e., amido groups). Thus, various active species including gases such as $N_2O$ or $CO_2$, hydride, $CH_2O$, $N(CH_3)(C_2H_5)$, etc., may be produced while zirconium atoms are oxidized. The active species may deteriorate the dielectric layer 135 formed by the adsorption on the substrate 100, so that electrical characteristics of the dielectric layer 135 may be degraded to cause side effects, e.g., a leakage current.

According to example embodiments, the inactive oxidant 120 having a relatively low reactivity may be provided into the process chamber 10 prior to providing the active oxidant 130 so that the ligands 110b may be substituted by the inactive oxidant 120. Thus, the side effects caused by an excessive reactivity of the active oxidant 130 may be mitigated or avoided. Therefore, the dielectric layer 135 having enhanced mechanical and electrical characteristics may be obtained.

FIGS. 6 to 11 are cross-sectional views illustrating methods of manufacturing a semiconductor device in accordance with example embodiments. Specifically, FIGS. 6 to 11 illustrate methods of manufacturing a dynamic random access memory (DRAM) device including a capacitor.

Figure 6:
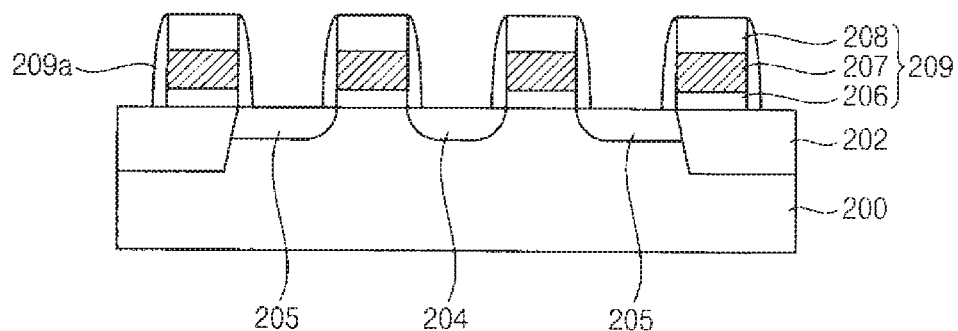
FIGS. 6, 7, 8, 9, 10 and 11 are cross-sectional views for describing methods of manufacturing a semiconductor device in accordance with example embodiments.

Referring to FIG. 6, an isolation layer 202 may be formed on a substrate 200. For example, the isolation layer 202 may be formed by a shallow trench isolation (STI) process.

A gate insulation layer, a gate electrode layer and a gate mask layer may be sequentially formed on the substrate 200. The gate insulation layer, the gate electrode layer and the gate mask layer may be patterned by, e.g., a photolithography process to form a plurality of gate structures 209 on the substrate 200. Each gate structure 209 may include a gate insulation layer pattern 206, a gate electrode 207 and a gate mask 208 sequentially stacked on the substrate 200. The gate electrode layer may be formed using doped polysilicon or a metal. The gate mask layer may be formed using silicon nitride.

Impurities may be implanted onto the substrate 200 using the gate structures 209 as ion-implantation mask to form first and second impurity regions 204 and 205 at upper portions of the substrate 200 adjacent to the gate structures 209. Transistors may be defined by the gate structures 209 and the impurity regions 204 and 205. The first and second impurity regions 204 and 205 may serve as source/drain regions of the transistors.

A spacer 209a may be further formed on a sidewall of the gate structure 209. The spacer 209a may include silicon nitride.

Figure 7:
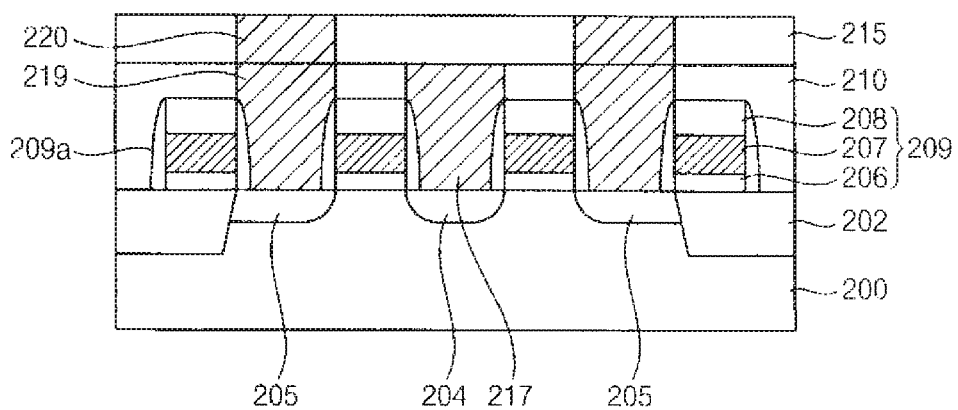

Referring to FIG. 7, a first insulating interlayer 210 covering the gate structures 209 and the spacers 209a may be formed on the substrate 200. The first insulating interlayer 210 may be partially removed to form first holes (not illustrated) exposing the impurity regions 204 and 205. In example embodiments, the first holes may be self-aligned with the gate structures 209 and the spacers 209a.

A first conductive layer filling the first holes may be formed on the substrate 200 and the first insulating interlayer 210. An upper portion of the first conductive layer may be planarized by a chemical mechanical polishing (CMP) process and/or an etch-back process until a top surface of the first insulating interlayer 210 is exposed to form first and second plugs 217 and 219 in the first holes. The first and second plugs 217 and 219 may make contact with the first and second impurity regions 204 and 205, respectively. The first conductive layer may be formed using doped polysilicon, a metal, etc. The first plug 217 may serve as a bit line contact.

A second conductive layer (not illustrated) contacting the first plug 217 may be formed on the first insulating interlayer 210 and the second conductive layer may be patterned to form a bit line (not illustrated). The second conductive layer may be formed using doped polysilicon, a metal, etc.

A second insulating interlayer 215 may be formed on the first insulating interlayer 210 and the first and second plugs 217 and 219. The second insulating interlayer 215 may be partially removed to form second holes (not illustrated) exposing top surfaces of the second plugs 219. A third conductive layer filling the second holes may be formed on the second plugs 219 and the second insulating interlayer 215. An upper portion of the third conductive layer may be planarized by a CMP process and/or an etch-back process until a top surface of the second insulating interlayer 215 is exposed to form third plugs 220 in the second holes. The third conductive layer may be formed using doped polysilicon, a metal, etc. The second and third plugs 219 and 220 may serve as capacitor contacts. Alternatively, the third plug 220 may make directly contact with the second impurity region 205 through the first and second insulating interlayers 210 and 215 without forming the second plug 219.

Figure 8:
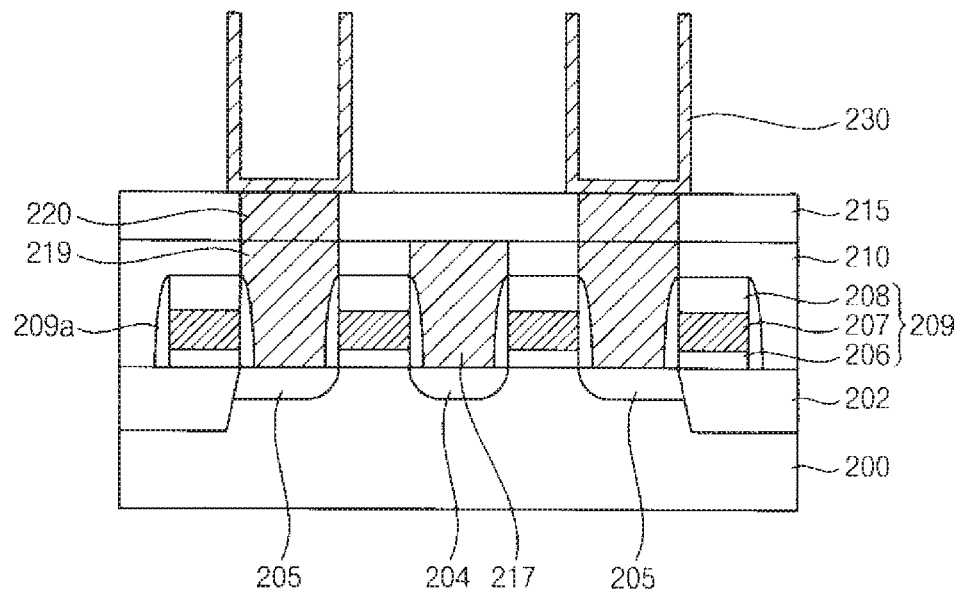

Referring to FIG. 8, an etch-stop layer (not illustrated) and a mold layer (not illustrated) may be formed on the second insulating interlayer 215. The mold layer and the etch-stop layer may be partially removed to form an opening (not illustrated) exposing a top surface of the third plug 220.

A lower electrode layer may be formed on a sidewall and a bottom of the opening and on a top surface of the mold layer. The lower electrode layer may be formed using doped polysilicon, or a metal or a metal nitride, e.g., titanium, titanium nitride, tantalum, tantalum nitride, tungsten nitride, ruthenium, and so on. A sacrificial layer may be formed on the lower electrode layer, and then the sacrificial layer and the lower electrode layer may be partially removed to expose the top surface of the mold layer. The sacrificial layer and the mold layer may be removed to form a lower electrode 230 electrically connected to the third plug 220.

Figure 9:
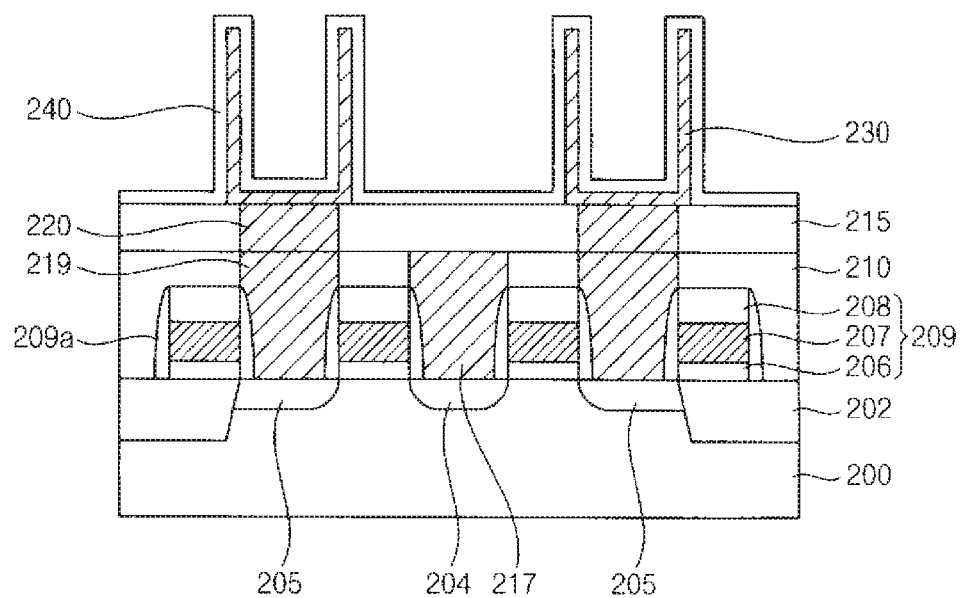

Referring to FIG. 9, a dielectric layer 240 covering the lower electrode 230 may be formed on the etch-stop layer and the second insulating interlayer 215. The dielectric layer 240 may be formed to have a uniform thickness on the lower electrode 230 using a high-k material. The dielectric layer 240 may be formed utilizing processes and materials substantially the same as or similar to those illustrated with reference to FIGS. 1 to 4.

Specifically, an organometallic precursor and an inactive oxidant may be provided on the lower electrode 230 to form a preliminary dielectric layer, and then an active oxidant may be provided on the preliminary dielectric layer to form the dielectric layer 240.

Figure 10:
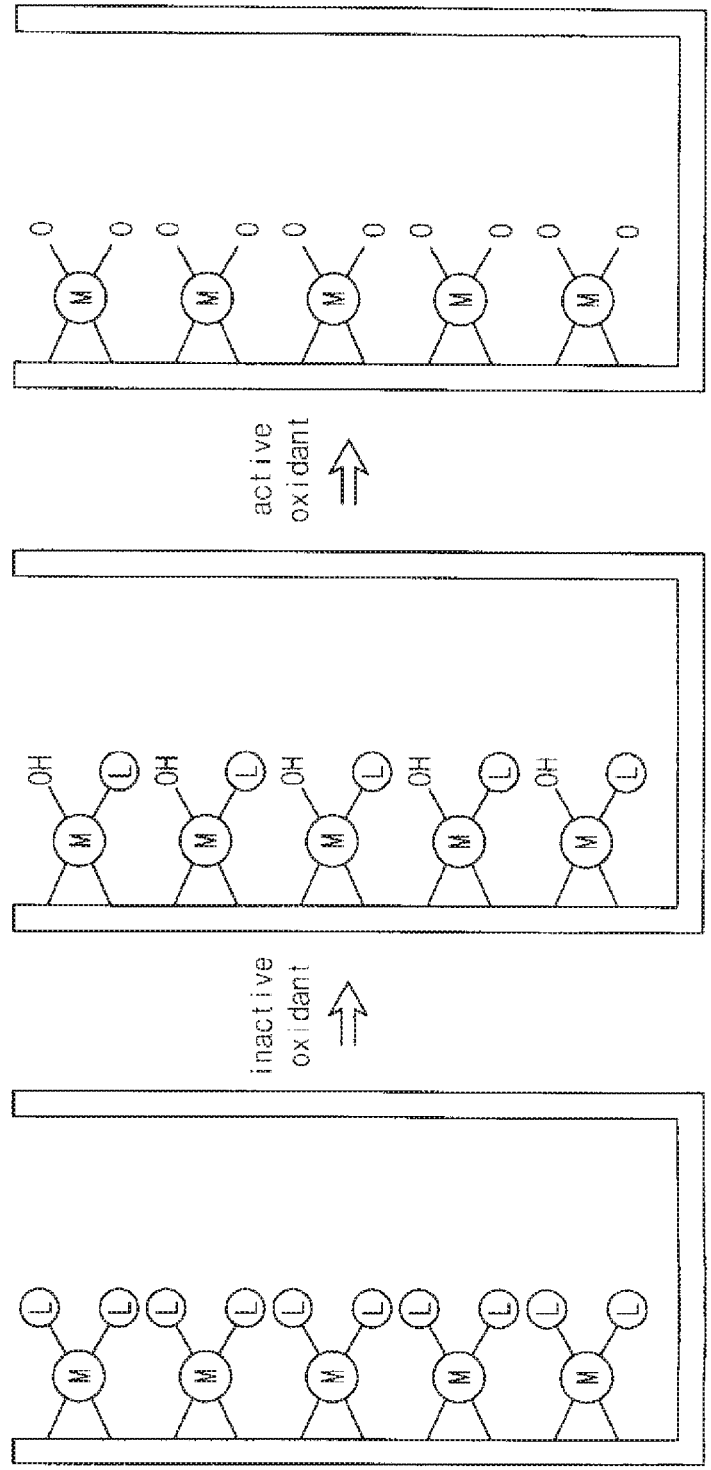

FIG. 10 is a cross-sectional view illustrating a mechanism of forming the dielectric layer 240 on the lower electrode 230. For convenience of explanation, the mechanism is illustrated only on a left inner wall of the lower electrode 230.

Referring to FIG. 10, a source gas may be provided onto the lower electrode 230 so that an organometallic precursor including a central metal (M) and ligands (L) may be adsorbed on a surface of the lower electrode 230. The inactive oxidant such as $H_2O$ may be provided onto the lower electrode 230 to be reacted with the adsorbed organometallic precursor, so that the preliminary dielectric layer may be formed on the lower electrode 230. FIG. 10 illustrates that one ligand (L) of each central metal (M) is substituted with a hydroxyl group. However, the number of the substituted ligands is not limited. The active oxidant such as $O_3$ may be provided on the preliminary dielectric layer 240 to form the dielectric layer on the lower electrode 230. The entire central metals (M) may be oxidized uniformly along a profile of the lower electrode 230 by the active oxidant.

When the dielectric layer 240 is formed using only the active oxidant, the dielectric layer 240 may not be formed uniformly as illustrated in FIG. 10 and a thickness of the dielectric layer 240 may not be adjusted properly. The active oxidant such as $O_3$ may induce a radical reaction, to thereby have a very high reactivity. Further, the reactivity of the active oxidant may be reduced drastically at a lower portion of the lower electrode 230. Thus, an adsorption between the organometallic precursor and the lower electrode 230 may be broken or damaged due to the excessive reactivity of the active oxidant at an upper portion of the lower electrode 230. In some cases, the upper portion of the lower electrode 230 may be also oxidized by the active oxidant. In contrast, the central metals (M) may not be sufficiently oxidized at the lower portion of the lower electrode 230 due to the reduced reactivity of the active oxidant, so that mechanical or electrical characterisitics of the dielectric layer may be degraded.

Meanwhile, the inactive oxidant such as $H_2O$ may induce a substitution reaction rather than a radical reaction, to thereby have a relatively low reactivity. Further, the inactive oxidant may have a constant reactivity throughout the profile of the lower electrode 230. Thus, when the dielectric layer 240 is formed using both the inactive oxidant and the active oxidant according to example embodiments, the disadvantages of the inactive oxidant and the active oxidant may be overcome in complementary manners. That is, the lower electrode 230 may be prevented from being directly oxidized and may have uniform mechanical or electrical properties throughout the entire profile thereof.

Figure 11:
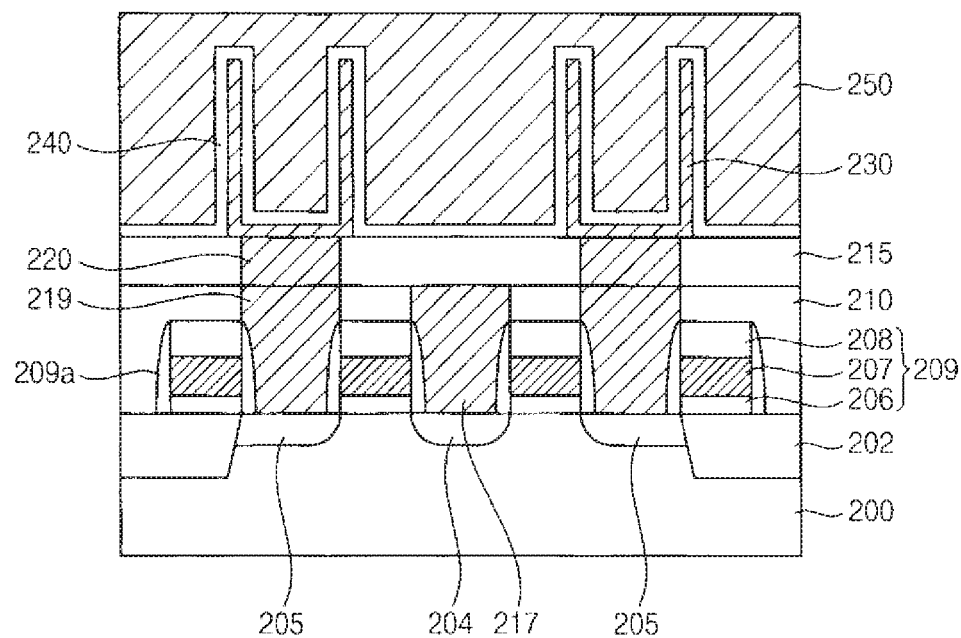

Referring to FIG. 11, an upper electrode 250 may be formed on the dielectric layer 240. The upper electrode 250 may be formed using doped polysilicon, or a metal or a metal nitride, e.g., titanium, titanium nitride, tantalum, tantalum nitride, tungsten nitride, ruthenium, and so on.

Accordingly, a capacitor including the lower electrode 230, the dielectric layer 240 and the upper electrode 250 may be obtained.

FIGS. 12 to 16 are cross-sectional views illustrating methods of manufacturing a semiconductor device in accordance with other example embodiments. Specifically, FIGS. 12 to 16 illustrate methods of manufacturing a floating gate type flash memory device. However, the methods may also be utilized, for example, to manufacture a charge trapping type memory device.

Figure 12:
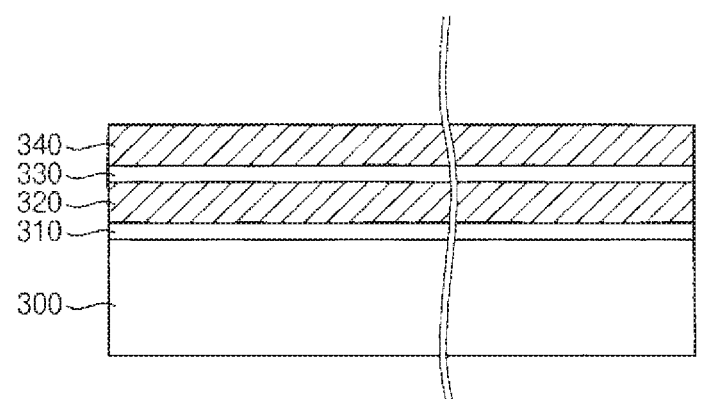
FIGS. 12, 13, 14, 15 and 16 are cross-sectional views for describing methods of manufacturing a semiconductor device in accordance with other example embodiments.

Referring to FIG. 12, a tunnel insulation layer 310, a floating gate layer 320, a dielectric layer 330 and a control gate layer 340 may be sequentially formed on a substrate 300.

The tunnel insulation layer 310 may be formed using an oxide such as silicon oxide, a nitride such as silicon nitride or a metal oxide by a chemical vapor deposition (CVD) process, an atomic layer deposition (ALD) process, a sputtering process, and so on. Alternatively, the tunnel insulation layer 310 may be formed by performing a thermal oxidation process on the substrate 300.

When the tunnel insulation layer 310 is formed using a metal oxide, the tunnel insulation layer 310 may be formed by processes substantially the same as or similar to those illustrated with reference to FIGS. 1 to 4.

The floating gate layer 320 may be formed using doped polysilicon and/or a metal having a high work function such as tungsten, titanium, cobalt, nickel, and so on. Here, for example, a CVD process, an ALD process, or a sputtering process may be used.

The dielectric layer 330 may be formed using a high-k dielectric material such as aluminum oxide, hafnium oxide, lanthanum oxide, lanthanum aluminum oxide, lanthanum hafnium oxide, hafnium aluminum oxide, titanium oxide, tantalum oxide or zirconium oxide, using for example a CVD process, an ALD process, or a sputtering process. The dielectric layer 330 may be formed by processes substantially the same as or similar to those illustrated with reference to FIGS. 1 to 4.

The control gate layer 340 may be formed using polysilicon and/or a metal or a metal nitride such as titanium, titanium nitride, tantalum, tantalum nitride, using for example a CVD process, an ALD process, or a sputtering process.

Figure 13:
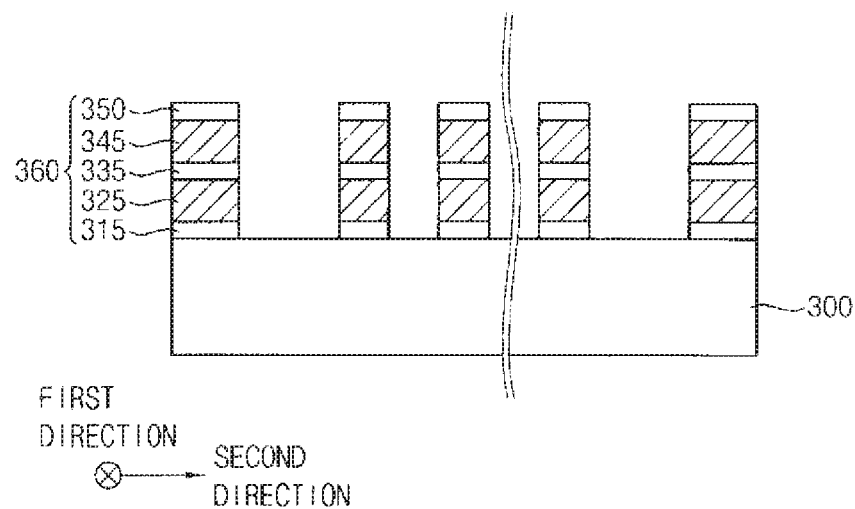

Referring to FIG. 13, a hard mask 350 may be formed on the control gate layer 340, and the control gate layer 340, the dielectric layer 330, the floating gate layer 320 and the tunnel insulation layer 310 may be sequentially and partially etched to form a plurality of gate patterns 360. Each gate pattern 460 may include a tunnel insulation layer pattern 315, a floating gate 325, a dielectric layer pattern 335, a control gate 345 and the hard mask 350 sequentially stacked on the substrate 300.

Each gate pattern 360 may extend in a first direction. The gate patterns 360 may be spaced apart from each other along a second direction substantially perpendicular to the first direction.

The gate patterns 360 may include a cell gate pattern, a ground selection line (GSL) and a string selection line (SSL) which may form a string. The string may include a plurality of cell gate patterns, e.g., 16 or 32 cell gate patterns. The GSL may be formed at one end of the string and the SSL may be formed at the other end of the string.

Figure 14:
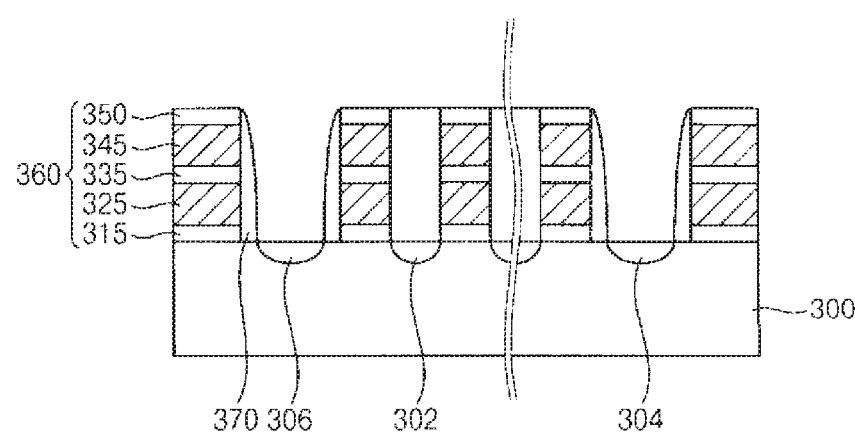

Referring to FIG. 14, a spacer layer (not illustrated) covering the gate patterns 360 may be formed on the substrate 300. The spacer layer may be anisotropically etched to form a spacer 370 on a sidewall of the gate pattern 360. Thus, a gate structure including the gate pattern 360 and the spacer 370 may be formed on the substrate 300.

Impurities may be implanted onto the substrate 300 by a ion-implantation process using the gate structure as an ion implantation mask to form first, second and third impurity regions 302, 304 and 306 at upper portions of the substrate 300 adjacent to the gate structures.

Figure 15:
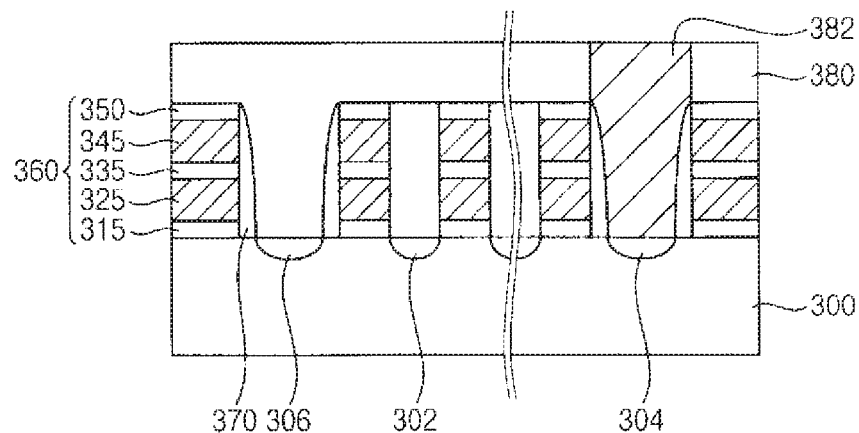

Referring to FIG. 15, a first insulating interlayer 380 covering the gate structures may be formed on the substrate 300. The first insulating interlayer 380 may be formed using an oxide such as boro-phosphor silicate glass (BPSG), undoped silicate glass (USG), spin on glass (SOG), and so on. Here, for example, a CVD process, an ALD process, or a sputtering process may be used.

The first insulating interlayer 380 may be partially removed to form a first opening (not illustrated) exposing the second impurity region 304. A first conductive layer filling the first opening may be formed on the substrate 300 and the first insulating interlayer 380. The first conductive layer may be formed using doped polysilicon, a metal or a metal silicide. An upper portion of the first conductive layer may be planarized until a top surface of the first insulating interlayer 380 is exposed to form a common source line (CSL) 382. The CSL 382 may fill the first opening and make contact with the second impurity region 304.

Figure 16:
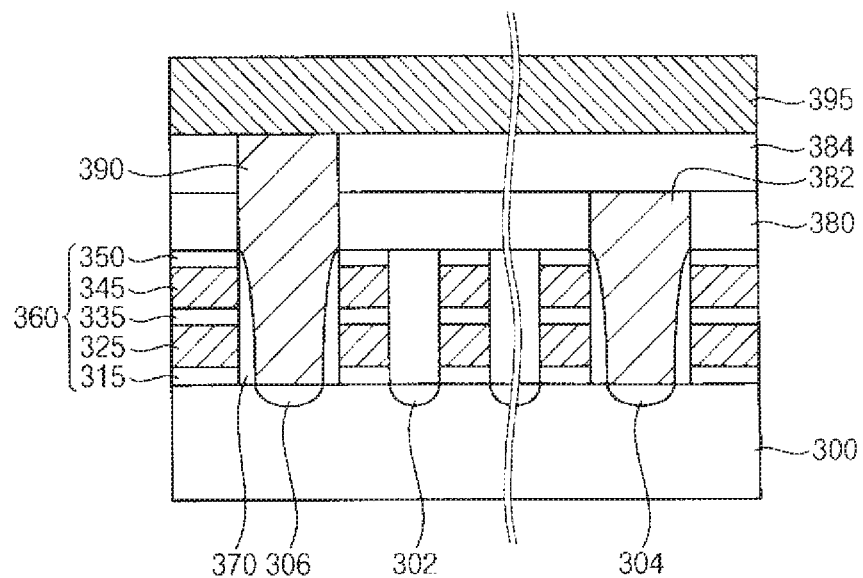

Referring to FIG. 16, a second insulating interlayer 384 may be formed on the first insulating interlayer 380 and the CSL 382. The second insulating interlayer 384 may be formed using an oxide such as BPSG, USG, SOG, and so on. Here, for example, a CVD process, an ALD process, or a sputtering process may be used.

The second and first insulating interlayers 384 and 380 may be partially removed to form a second opening (not illustrated) exposing the third impurity region 306. A second conductive layer filling the second opening may be formed on the second insulating interlayer 384. The second conductive layer may be formed using doped polysilicon, a metal or a metal silicide. An upper portion of the second conductive layer may be planarized until a top surface of the second insulating interlayer 384 is exposed to form a bit line contact 390. The bit line contact 390 may fill the second opening and make contact with the third contact region 306.

A third conductive layer may be formed on the second insulating interlayer 384 and the bit line contact 390. The third conductive layer may be patterned to form a bit line 395 electrically connected to the bit line contact 390 and extending in the second direction. The third conductive layer may be formed using doped polysilicon, a metal or a metal silicide.

By performing the above-described processes, a flash memory device according to example embodiments may be manufactured.

Evaluation on Electrical Characteristics of Dielectric Layers

Electrical characteristics of dielectric layers according to example embodiments were evaluated by conducting the following experiments. The results are shown in FIGS. 17A and 17B.

Figure 17A:
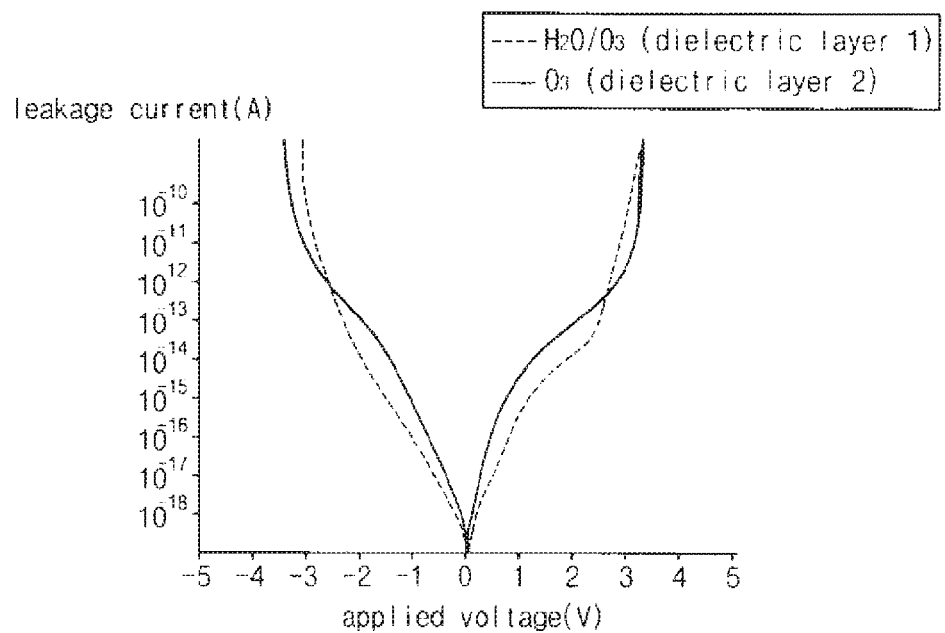
FIGS. 17A and 17B are graphs showing leakage current characteristics of dielectric layers.

Referring to FIG. 17A, a dielectric layer 1 was formed using TEMAZ as an organometallic precursor, $H_2O$ as an inactive oxidant and $O_3$ as an active oxidant by the processes according to example embodiments. A leakage current of the dielectric layer 1 was measured and the result is represented by a dotted line. A dielectric layer 2 was formed using only TEMAZ and $O_3$. A leakage current of the dielectric layer 2 was measured and the result is represented by a solid line. As shown in FIG. 17A, the dielectric layer 1 that was formed using both the inactive oxidant and the active oxidant was shown to have a lower leakage current than that of the dielectric layer 2 when a voltage below about 2V was applied.

Figure 17B:
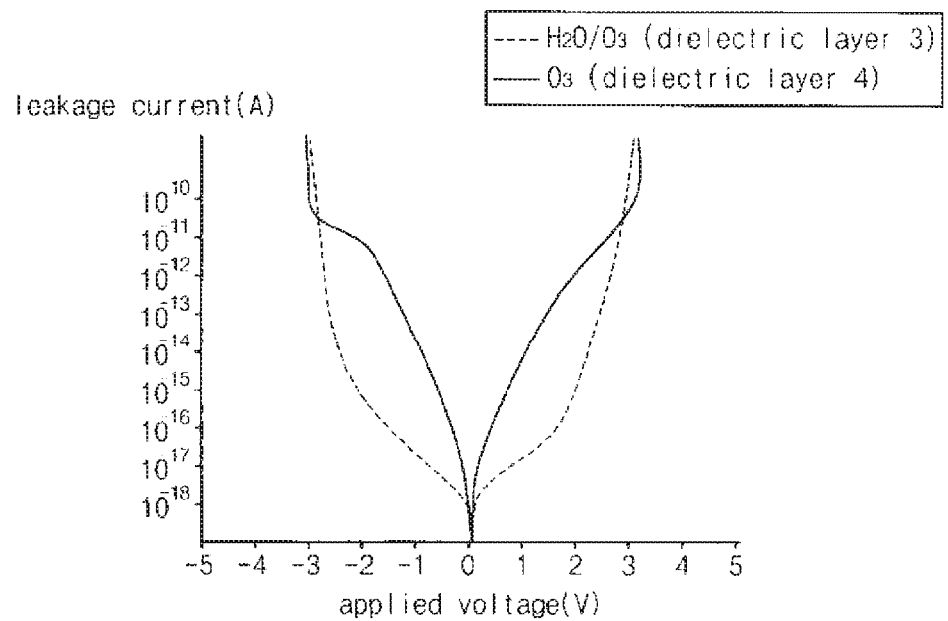

Referring to FIG. 17B, a dielectric layer 3 was formed using bis-diisopropylamido-bis-dimethylamido-zirconium as the organometallic precursor, $H_2O$ as the inactive oxidant and $O_3$ as the active oxidant by the processes according to example embodiments. A leakage current of the dielectric layer 3 was measured and the result is represented by a dotted line. A dielectric layer 4 was formed using only the same organometallic precursor as in the dielectric layer 3 and $O_3$. A leakage current of the dielectric layer 4 was measured and the result is represented by a solid line. As shown in FIG. 17B, the dielectric layer 3 that was formed using both the inactive oxidant and the active oxidant was shown to have a lower leakage current than that of the dielectric layer 4 in an approximately entire range of applied voltage.

In the above experiments shown in FIGS. 17A and 17B, the dielectric layers formed using both $H_2O$ and $O_3$ had enhanced electrical characteristics. Particularly, the dielectric layer 3 that was formed using the organometallic precursor containing heteroleptic ligands was shown to have relatively enhanced electrical characteristics. That is, the organometallic precursor containing heteroleptic ligands rather than homoleptic ligands may be preferably used for forming a dielectric layer from the viewpoint of improving reliability of a semiconductor device.

Evaluation on Stability of a Lower Electrode

A dielectric layer was formed on a lower electrode including titanium nitride and a sheet resistance of the lower electrode was measured in order to detect the degree of oxidation. When the lower electrode has a high value of the degree of oxidation, i.e., the lower electrode has a high sheet resistance, structural stability of the lower electrode may be reduced, and thereby cause defects, e.g., bending of the lower electrode.

When the lower electrode was exposed to $O_3$ (the active oxidant) for about 120 seconds to form a dielectric layer, the sheet resistance of the lower electrode was 37352 per a unit area. Meanwhile, when the lower electrode was exposed to $H_2O$ (the inactive oxidant) for about 6 seconds and $O_3$ (the active oxidant) for about 40 seconds, the sheet resistance of the lower electrode was 312Ω per a unit area. That is, when both the inactive oxidant and the active oxidant are used to form a dielectric layer, a lower electrode may be less oxidized so that structural stability of the lower electrode may be improved.

According to example embodiments, an organometallic precursor may be adsorbed on a substrate or a lower electrode, and then an inactive oxidant having a relatively low reactivity and an active oxidant having a relatively high reactivity may be provided simultaneously or sequentially to form a dielectric layer. Accordingly, the disadvantages of the inactive oxidant and the active oxidant individually may be overcome in complementary fashion so that the dielectric layer having favorable electrical characteristics and structural stability may be formed. The methods of forming a dielectric layer according to example embodiments may be applied to forming insulation layers or dielectric layers of various semiconductor devices.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, comprising:
    forming a lower electrode on a substrate;
    adsorbing an organometallic precursor on the lower electrode, the organometallic precursor including a central metal and ligands bound to the central metal;
    providing an inactive oxidant onto the lower electrode to form a preliminary dielectric layer, the inactive oxidant being reactive with the organometallic precursor;
    providing an active oxidant onto the lower electrode after providing the inactive oxidant such that the preliminary dielectric layer is transformed into a dielectric layer, the active oxidant having a higher reactivity than a reactivity of the inactive oxidant; and
    forming an upper electrode on the dielectric layer.

2. The method of claim 1, wherein the inactive oxidant includes at least one selected from the group consisting of water ($H_2O$), oxygen ($O_2$), nitrous oxide ($N_2O$), alcohol and a metal alkoxide, and
    wherein the active oxidant includes at least one selected from the group consisting of ozone ($O_3$), $O_2$ plasma, remote plasma $O_2$, $N_2O$ plasma and $H_2O$ plasma.

3. A method of forming a multi-layer dielectric layer, comprising:
    loading a substrate into a process chamber;
    performing a first process which includes introducing a first organometallic precursor into the process chamber, introducing a first inactive oxidant that is reactive with the first organometallic precursor into the process chamber, and introducing a first active oxidant that is reactive with the first organometallic precursor into the process chamber after introducing the first inactive oxidant, wherein the first organometallic precursor includes a first central metal and first ligands bound to the first central metal, and wherein the first active oxidant has a higher reactivity with the first organometallic precursor than a reactivity of the first inactive oxidant with the first organometallic precursor; and
    performing a second process which including introducing a second organometallic precursor into the process chamber, introducing a second inactive oxidant that is reactive with the second organometallic precursor into the process chamber, and introducing a second active oxidant that is reactive with the second organometallic precursor into the process chamber after introducing the second inactive oxidant, wherein the second organometallic precursor includes a second central metal and second ligands bound to the second central metal, and wherein the second active oxidant has a higher reactivity with the second organometallic precursor than a reactivity of the second inactive oxidant with the second organometallic precursor.

4. The method of claim 3, wherein the first organometallic precursor is different than the second organometallic precursor.

5. The method of claim 4, wherein first process forms a first dielectric layer on the substrate, and the second process forms a second dielectric layer on the first dielectric layer, wherein the first dielectric layer is one of a hafnium oxide layer, an aluminum oxide layer, and a zirconium oxide layer, and the second dielectric layer is a different one of a hafnium oxide layer, an aluminum oxide layer, and a zirconium oxide layer.

6. The method of claim 3, wherein the first and second inactive oxidants independently include at least one selected from the group consisting of water ($H_2O$), oxygen ($O_2$), nitrous oxide ($N_2O$), alcohol and a metal alkoxide, and
    wherein the first and second active oxidants independently include at least one selected from the group consisting of ozone ($O_3$), $O_2$ plasma, remote plasma $O_2$, $N_2O$ plasma and $H_2O$ plasma.

7. The method of claim 3, wherein the substrate includes a conductive structure on which the multi-layer dielectric layer is formed.

8. The method of claim 3, wherein the first process further includes purging the process chamber after introducing the first organometallic precursor into the process chamber and before introducing the first inactive oxidant into the process chamber, and again purging the process chamber after introducing the first inactive oxidant into the process chamber and before introducing the first active oxidant into the process chamber.

9. The method of claim 8, wherein the second process further includes purging the process chamber after introducing the second organometallic precursor into the process chamber and before introducing the second inactive oxidant into the process chamber, and again purging the process chamber after introducing the second inactive oxidant into the process chamber and before introducing the second active oxidant into the process chamber.

\* \* \* \* \*